United States Patent [19]
Suehiro et al.

[11] Patent Number: 5,373,628
[45] Date of Patent: Dec. 20, 1994

[54] AUTOMATIC WIRING METHOD

[75] Inventors: Akihiko Suehiro; Tsuneo Oka, both of Kawasaki, Japan

[73] Assignee: Fujitsu Limited, Kawasaki, Japan

[21] Appl. No.: 950,132

[22] Filed: Sep. 24, 1992

[30] Foreign Application Priority Data

Oct. 3, 1991 [JP] Japan .................. 3-256230

[51] Int. Cl.$^5$ .............................. H01K 3/10
[52] U.S. Cl. ........................ 29/850; 29/847; 29/745
[58] Field of Search ............... 29/850, 847, 853, 745

[56] References Cited

U.S. PATENT DOCUMENTS

| | | | |
|---|---|---|---|
| 4,627,162 | 12/1986 | Holt | 29/847 |
| 4,648,180 | 3/1987 | Holt | 29/847 |
| 4,734,980 | 4/1988 | Nakamura et al. | 29/850 |
| 4,934,044 | 6/1990 | Hasegawa | 29/850 |

FOREIGN PATENT DOCUMENTS 1-225335  9/1989  Japan ...................... 29/850

OTHER PUBLICATIONS

IBM Technical Disclosure Bulletin vol. 11, No. 12 May 1969 p. 1699 by J. T. Kolias.

*Primary Examiner*—Carl J. Arbes
*Attorney, Agent, or Firm*—Staas & Halsey

[57] ABSTRACT

An automatic wiring method includes a first step of finding locations at which diagonal wiring is required at the time of wiring processing, a second step of approximating the shapes of part pins associated with these locations by rectangular shapes and reducing and changing these approximated shapes into shapes capable of being wired by 90° turns, a third step of executing automatic wiring processing for 90° turns, a fourth step of finding a location at which a clearance between a wiring pattern obtained by the wiring processing for 90° turns and an actual part pin becomes less than a stipulated value and a clearance error is generated, and a fifth step of shaping a 90°-turn wiring pattern at this location into a diagonal wiring pattern so as to satisfy the clearance.

16 Claims, 15 Drawing Sheets

AUTOMATIC WIRING METHOD

BACKGROUND OF THE INVENTION

This invention relates to an automatic wiring method. More particularly, the invention relates to an automatic wiring method for performing wiring which turns at angles in units of 90° between predetermined pins based upon part placement data, such as part pin position or part pin shape, and wiring data which specifies the positions of pins that will be at identical potential, and performing automatic wiring processing in which diagonal wiring is added at appropriate locations.

The demand for high-density mounting of parts in recent years has led to parts with greater numbers of pins and to reduced spacing between pins, as a result of which the automatic wiring of printed circuit boards has become more difficult. Consequently, there is demand for an automatic wiring method that is capable of dealing with high-density mounting.

Known methods of finding wiring routes in automatic wiring processing include the maze method, also referred to as Lee's algorithm, the line search method and the area search method. However, in order to execute automatic wiring processing efficiently, all of these methods entail the performance of simple modeling, in which obstacles (part pins, circuit board lands and the like) are put into the form of rectangular models, by way of example. In order to avoid these obstacles, mainly curved wiring processing is performed in which turns are made in 90° units.

FIGS. 14(a) and (b) are diagrams for describing the line search method. Numeral 1 denotes a printed circuit board, 2a–2d represent obstacles, and A, B represent the position of pins that are desired to be wired together. According to the line search method, horizontal and vertical lines (wiring lines) that are capable of being are generated successively from the two pin positions A, B that are to be wired, and a printed wiring route is found by determining whether a route is completed by these line segments. More specifically, horizontal line segments are drawn from each of the two points A and B until these line segments strike an obstacle. These line segments are designated provisional line segments $L_{01}$, $L_{01}'$ of level 0. If the provisional line segments of level 0 overlap, then this means that a route connecting A and B has been found. A printed wiring route can be discovered by retracing the line segments in the opposite direction.

If these provisional line segments do not overlap, then vertical line segments are generated as provisional line segments $L_{11}$, $L_{12}$, $L_{13}$, ... ; $L_{11}'$, $L_{12}'$, $L_{13}'$ ... of level 1 from all points (points having a spacing of one pitch on the wiring line) on the provisional line segment of level 0. If provisional line segments generated from each of the points A, B intersect, a printed wiring route is constructed by retracing these line segments in the opposite direction. If a route still cannot be found, provisional line segments of level 2, level 3 and so on are generated.

In the example of FIGS. 14(a) and (b) a printed wiring route PPT [FIG. 14(b)] is discovered by the intersection between a line segment $L_{21}$ of level 2 generated from the A side and the line segment $L_{11}'$ of level 1 generated from the B side.

FIGS. 15(a)–(c) are views for describing the area search method. Numeral 5 denotes a printed circuit board, 6a–6f designate pads, and 7a–7d represent patterns that have already been wired. When a search is made for a printed wiring route from a source pad 6a to a target pad (not shown), a rectangular expansion area 7a, which is the result of expanding the area of the source pad 6a in all directions until it strikes an obstacle, is obtained [see FIG. 15(b)]. Here the edge (indicated by the dashed line) contacting the obstacle is referred to as a "blocked edge" and is excluded from the area which is the object of the search. Edges not contacting the obstacle are referred to as "free edges". These portions are expanded until they similarly strike obstacles, whereby rectangular expansion areas 8a–8d are found [see FIG. 15(c)]. Thereafter, the free edges of these expansion areas are expanded in similar fashion, thereby successively obtaining expansion areas 9a, 9a' ... and so on. Eventually, the target pad or an expansion area from the target pad is reached to find the printed wiring route. For the details of the area search method, refer to A. C. Finch et. al. "A Method of Gridless Routing of Printed Circuit Boards", *Proceedings of the 22nd Design Automation Conference*, 1985, pp. 509–515.

In a case where diagonal wiring (45° printed wiring) is necessary after a route is obtained by wiring processing at turns in 90° units, e.g., in a case where a 45° turn results in a shorter wiring distance and therefore is advantageous in terms of electrical characteristics, a 90° turn is shaped into a 45° turn, as illustrated in FIG. 16. However, since diagonal wiring processing can not be performed automatically, the operation to obtain such diagonal wiring is troublesome.

With wiring at 90° turns, the number of wiring lines capable of being wired between part pins is limited and therefore a problem which arises is that the method cannot cope with high-density mounting.

Furthermore, with increasingly higher density mounting, parts have recently appeared having pin arrays that cannot be wired without using diagonal (45°) printed wires at the time of wiring processing. With the conventional automatic wiring method using 90° turns, these parts cannot be wired, and such a method cannot cope with the mounting of parts in higher densities. FIGS. 17(a) and (b) are diagrams for describing this problem. This represents a case in which ten wiring lines (tracks) are capable of being arranged in one grid (2.54 mm). With conventional automatic wiring processing using 90° turns, this processing is carried out by making the shapes of obstacles (part pins) 5a–5e all approximate minimum rectangular shapes 5a'–5e', which include these shapes, in order to raise the speed of processing. Consequently, whereas two wiring lines $L_{11}$, $L_{12}$; $L_{21}$, $L_{22}$; $L_{31}$, $L_{32}$; $L_{41}$, $L_{42}$ can be arranged between mutually adjacent part pins with diagonal wiring, as depicted in FIG. 17(b), not even a single wiring line can be provided with wiring that relies upon 90° turns, as illustrated in FIG. 17(a).

Accordingly, though it has been considered to perform diagonal wiring automatically by a diagonal wiring algorithm instead of using the 90°-turn wiring processing, this is difficult to realize because the processing is too complicated.

SUMMARY OF THE INVENTION

Accordingly, an object of the present invention is to provide an automatic wiring method whereby diagonal wiring can be performed automatically using conventional 90°-turn wiring processing by applying predetermined pre-processing and post-processing.

Another object of the present invention is to provide an automatic wiring method whereby diagonal wiring can be performed automatically by simple processing.

Still another object of the present invention is to provide an automatic wiring method through which the number of wiring lines capable of being arranged between the shapes of part pins (lands) can be increased to make high-density mounting possible.

According to the present invention, the foregoing objects are attained by providing an automatic wiring method comprising a first step of finding locations at which diagonal wiring is required at the time of wiring processing, a second step of approximating the shapes of part pins associated with these locations by rectangular shapes and reducing and changing these approximated shapes into shapes capable of being wired by 90° turns, a third step of executing automatic wiring processing for 90° turns, a fourth step of finding a location at which a clearance between a wiring pattern obtained by the wiring processing for 90° turns and an actual part pin becomes less than a stipulated value and a clearance error is generated, and a fifth step of shaping a 90°-turn wiring pattern at this location into a diagonal wiring pattern so as to satisfy the clearance.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

DESCRIPTION OF THE PREFERRED EMBODIMENTS (a) General Features of the Present Invention FIGS. 1(a)–(d) are diagram for describing the general features of an automatic wiring method according to the present invention.

In FIGS. 1(a)–(d), DT represents data which includes part placement data such as part pin position or part pin shape, and wiring data which specifies the positions of pins that will be at identical potential. Numeral 11 denotes a searching unit for finding locations at which diagonal wiring is required at the time of wiring processing, 12 a shape revising unit for reducing and changing part shapes in such a manner that wiring at 90° turns can be performed, 13 an automatic wiring processing unit for executing automatic wiring processing for 90° turns 14, a searching unit for finding locations at which a clearance error is generated, and 15 a shaping unit for shaping 90°-turn wiring patterns into diagonal wiring patterns.

Figure 1A:
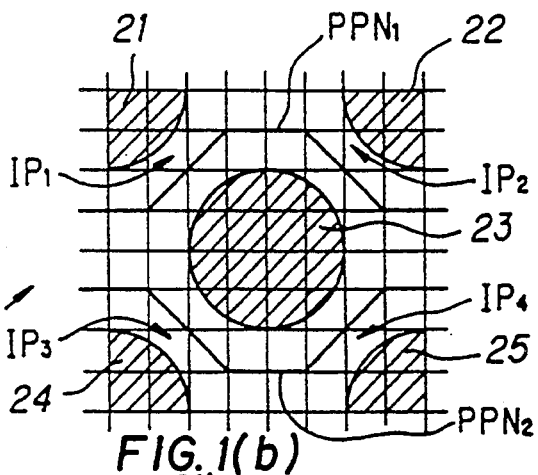
FIGS. 1(a)–(d) are diagrams for describing the general features of the present invention.
Figure 1B:
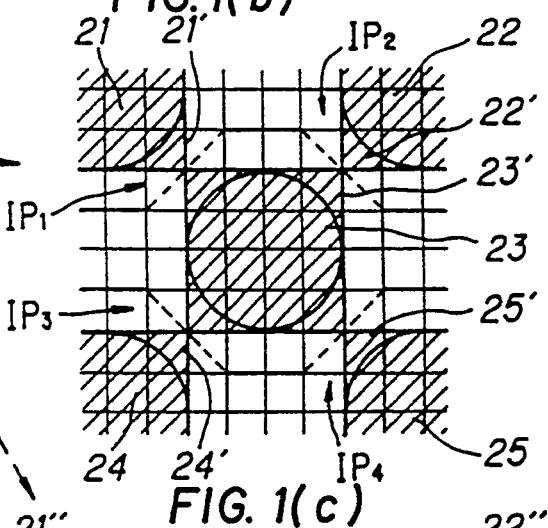
Figure 1C:
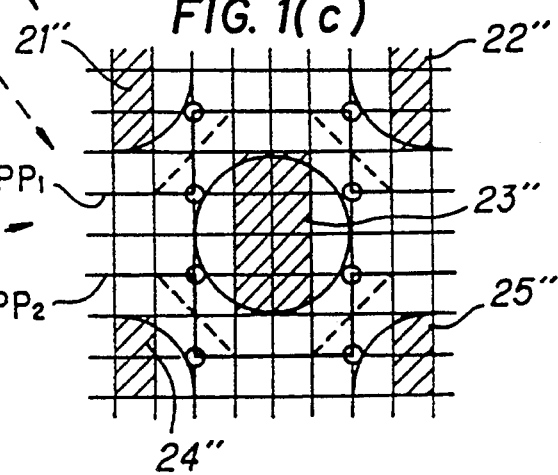
Figure 1D:
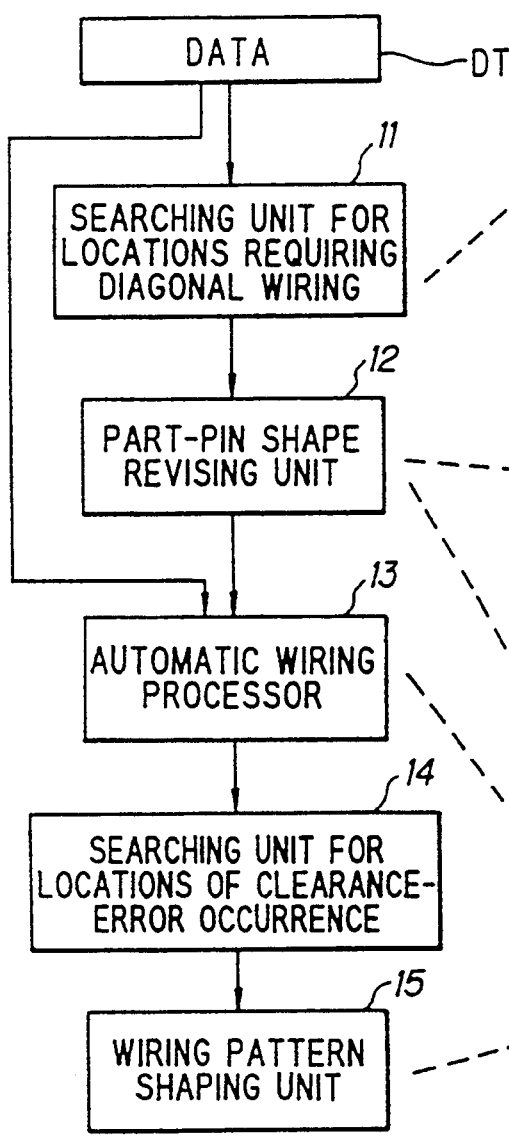

On the basis of the part placement data, the searching unit 11 finds locations $IP_1$–$IP_4$ [see FIG. 1(a)] at which diagonal wiring is required. The shape revising unit 12 approximates pin shapes (land shapes) 21–25 of part pins associated with the locations $IP_1$–$IP_4$ by rectangular shapes 21′–25, respectively [see FIG. 1(b)], and reduces and changes these approximated shapes to shapes 21″–25″, respectively [see FIG. 1(c)] so as to make possible wiring equivalent to diagonal wiring by 90°-turn wiring. On the basis of the wiring data or the shape data after shape reduction and change, the automatic wiring processing unit 13 executes automatic wiring processing for 90° turns so as to generate 90°-turn wiring patterns PP1, PP2. The searching unit 14 obtains the clearances between the 90°-turn wiring patterns PP1, PP2 and actual part pin shapes 21–25 and finds locations at which the clearance is less than a stipulated value as locations at which a clearance error is generated [see the white circles in FIG. 1(c)]. The wiring-pattern shaping unit 15 shapes the 90°-turn wiring patterns at these locations into diagonal wiring patterns [see FIG. 1(c)] so as to satisfy the clearances and eventually creates wiring patterns PPN1, PPN2 which include diagonal wires [see FIG. 1(a)].

By thus applying predetermined pre-processing and post-processing before and after 90°-turn wiring processing, diagonal wiring can be performed automatically by simple processing using the conventional 90°-turn wiring processing. Moreover, the number of wiring lines capable of being disposed between parts can be increased to make high-density mounting possible.

(b) Configuration of the Automatic Wiring System

Figure 2:
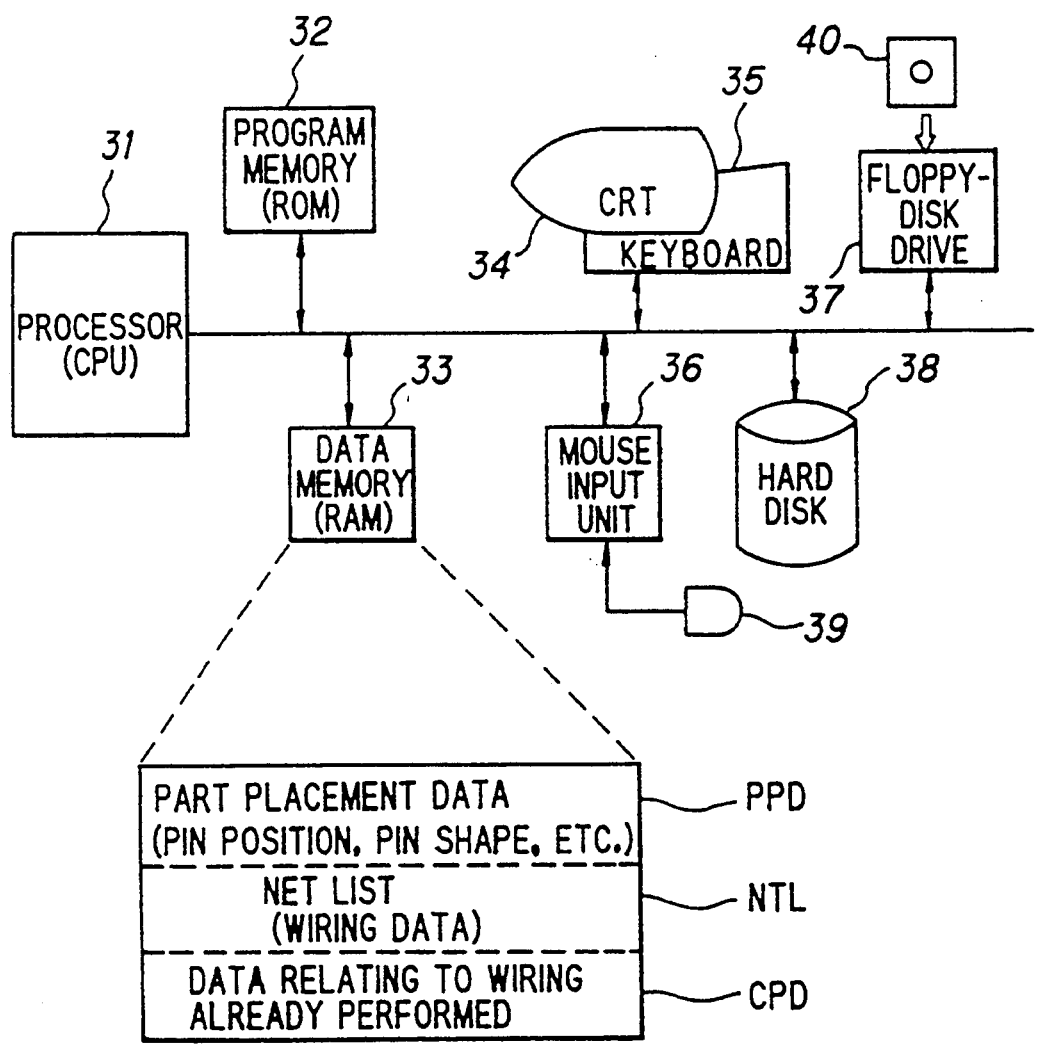
FIG. 2 is a block diagram showing the construction of an embodiment of an automatic wiring system for executing automatic wiring processing according to the present invention.

FIG. 2 is a block diagram showing the configuration of a computer-aided system (the automatic wiring system) for performing automatic wiring processing according to the present invention. The system includes a processor 31, a program memory (ROM) 32 for storing an automatic-wiring processing program, described below, a data memory (RAM) 33 for storing various data, a display unit 34, a keyboard 35, a mouse input unit 36, a floppy-disk drive 37, a large-capacity storage device 38 such as a hard-disk drive, a mouse 39 and a floppy 40.

Data from the floppy or hard disk necessary for automatic wiring processing is inputted to and stored in the data memory 33. Examples of the data necessary for automatic wiring processing are as follows:

(1) the shapes of parts and part pins, as well as the shapes of circuit-board lands;
(2) the direction in which the parts are arranged on the printed circuit board;
(3) the positions of part pins and circuit-board lands;
[(1)–(3) above represent part placement data PPD];
(4) information indicative of pins at the same potential, or in other words, wiring data (net list) NTL indicating which pins are to be wired together; and
(5) data CPD indicative of wiring already completed.

Figure 3:
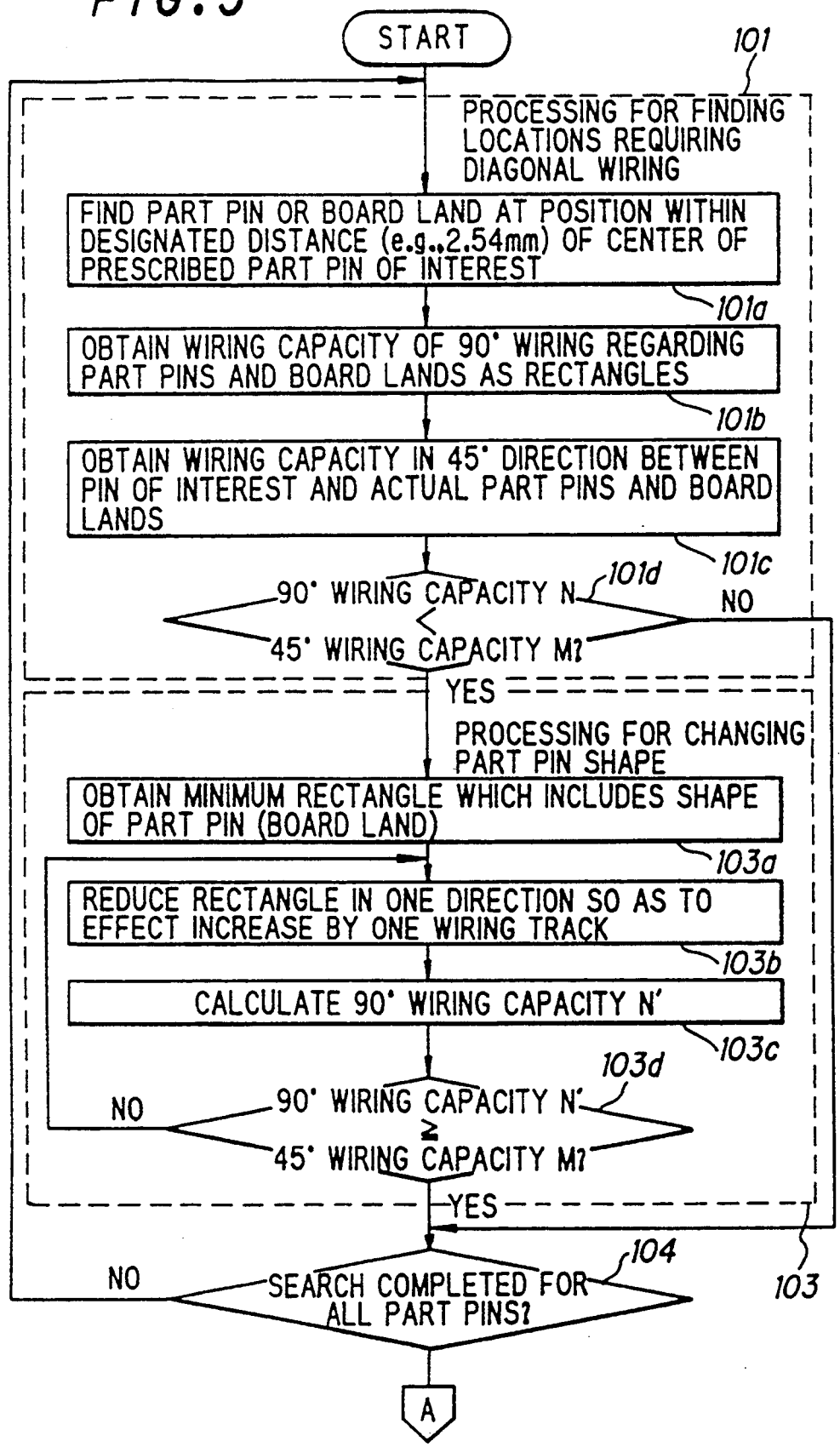
FIG. 3 is a first flowchart of automatic wiring processing according to the present invention.
Figure 4:
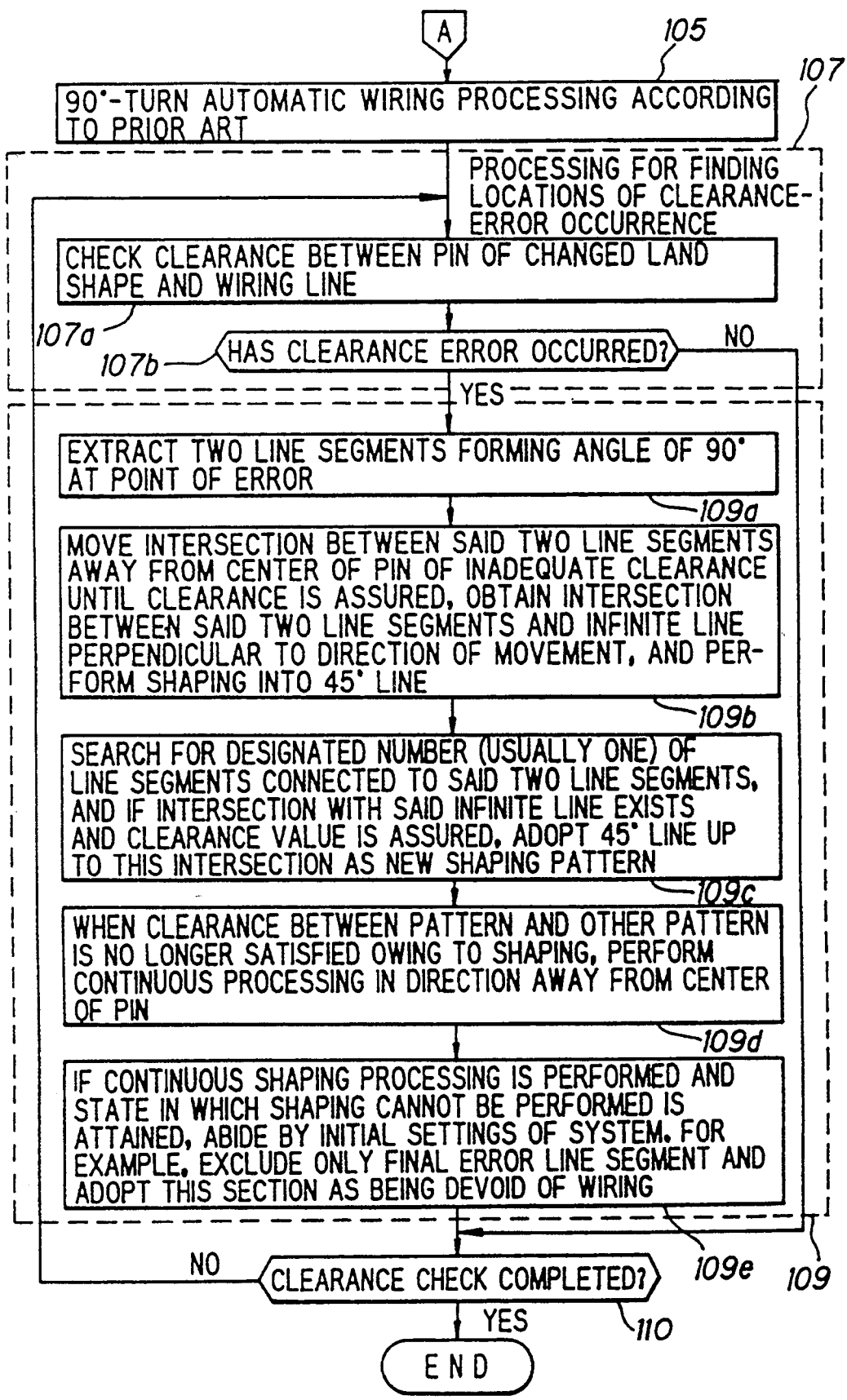
FIG. 4 is a second flowchart of automatic wiring processing according to the present invention.

FIGS. 3 and 4 are flowcharts of automatic wiring processing according to the present invention.

(1) Processing for finding locations at which diagonal wiring is required

When a command for execution of automatic wiring processing enters the processor 31, the latter, based upon the part placement data that has been stored in the RAM 33, finds locations at which diagonal wiring is required at the time of wiring processing (step 101).

Figure 5A:
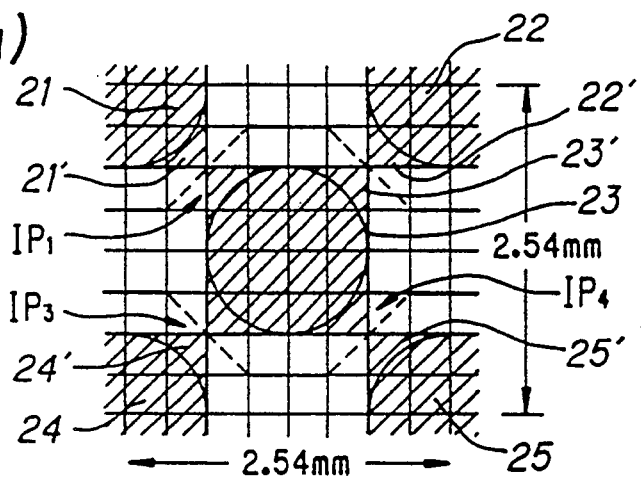
FIGS. 5(a)–(c) are diagrams for describing automatic wiring processing according to the present invention.
Figure 5B:
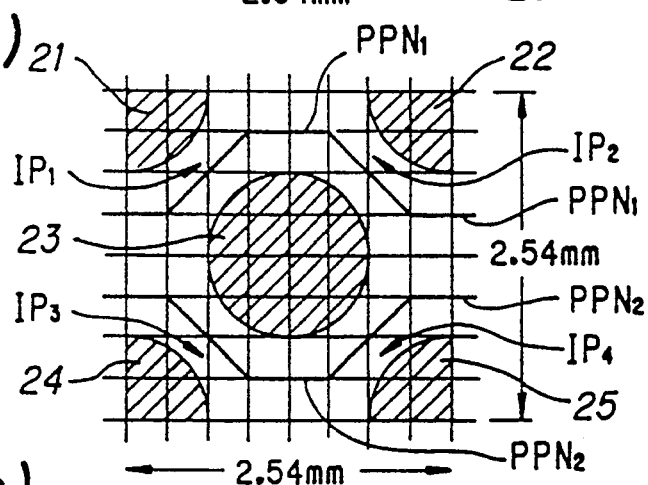
Figure 5C:
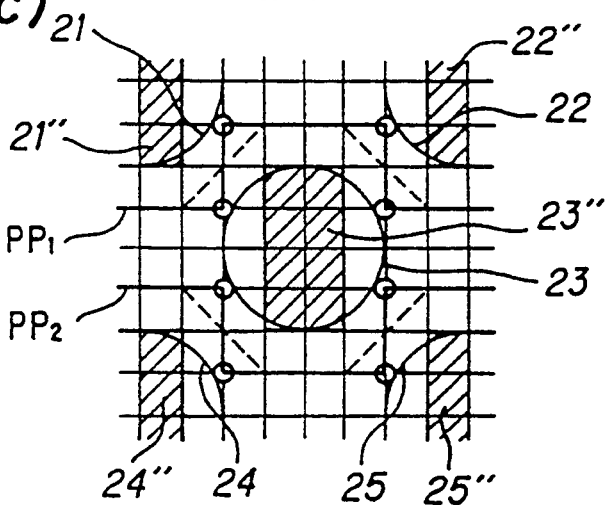
Figure 6A:
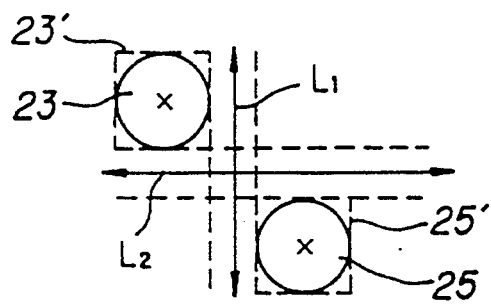
FIGS. 6(a) and (b) are diagrams for describing the finding of locations at which diagonal wiring is required.

Specifically, the processor 31 focuses its attention on a pin shape (land shape) 23 of a prescribed part pin (see FIGS. 5(a)–(c)) and seeks part pin shapes 21–22, 24–25 or circuit-board lands situated within a designated distance, e.g., 2.54 mm, from the center of the pin 23 (step 101a). In FIGS. 6(a) and (b) it should be noted that a maximum of eight tracks are capable of being inserted in one grid interval (2.54 mm).

If part pin shapes or circuit-board lands are present within the designated distance, the processor 31 approximates the pin shape 23 of the pin of interest and the pin shapes 21–22, 24–25 of the part pins within the designated distance by rectangular shapes (the minimum rectangular shapes which include the pins) 23', 21'–25', respectively, and obtains the number N of 90°-turn wiring lines (the wiring capacity) which satisfy the clearances between the approximated shape 23' of interest and the approximated shapes 21', 22', 24', 25' (step 101b). In the example of FIGS. 5(a)–(c) N=0 holds.

Next, the processor 31 obtains the number M of 45°-direction wiring lines (the wiring capacity) which satisfy the clearances between the pin of interest and the actual pin shapes of each of the part pins within the designated distance (step 101c). In the example of FIGS. 5(a)–(c) M=1 holds. When N<M holds, it is judged that diagonal wiring (indicated by the dashed lines) is required at the locations $IP_1$–$IP_4$ [see FIG. 5(a)] between the pin of interest and each of the aforesaid pins within the designated distance. When N≧M holds, it is judged that diagonal wiring is unnecessary (step 101d).

Figure 6B:
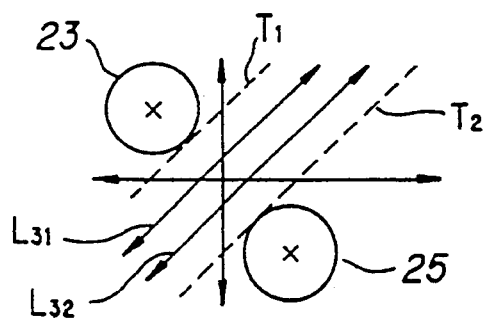

FIGS. 6(a) and (b) are diagrams for describing an example of computation of wiring capacity. Numeral 23 denotes the pin shape (land shape) of the part pin of interest, 25 the pin shape of a part pin within the designated distance, and 23', 25' the minimum rectangular shapes of the pin shapes 23, 25, respectively. As shown in FIG. 6(a), in case of wiring at a 90° turn, single wiring lines $L_1$, $L_2$ can be passed in the vertical and horizontal directions, respectively, so as to satisfy the clearance, and therefore N=1 holds (when the numbers of lines in the vertical and horizontal directions differ, the larger number is adopted as N). In case of 45° diagonal wiring, as illustrated in FIG. 6(b), two wiring lines $L_{31}$, $L_{32}$ can be passed so as to satisfy the clearance, i.e., in such a manner that the clearance between 45° tangent lines $T_1$, $T_2$ to the pin shapes 23, 25, respectively, or the clearance between mutually adjacent wiring lines, exceeds the stipulated value. Here, M=2 holds.

(2) Processing for changing part pin shape

If locations requiring diagonal wiring are found to be present by the foregoing processing, the processor 31 approximates the land shapes 21–25 of the part pins on both sides of the locations $IP_1$–$IP_4$ by the rectangular shapes 21'–25', respectively [FIG. 5(a)], and reduces the approximated shapes 21'–25' to shapes 21''–25'', respectively [FIG. 5(c)], so as to make possible 90°-turn wiring equivalent to the wiring capacity of the diagonal lines (step 103).

Figure 7:
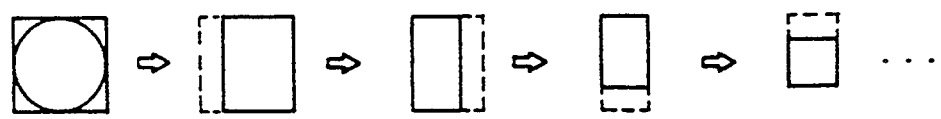
FIG. 7 is a diagram for describing processing for changing the shape of a rectangular area.

More specifically, the processor 31 approximates the land shapes 21–25 of the part pins on both sides of the locations $IP_1$–$IP_4$ requiring diagonal wiring as the minimum rectangular shapes 21'–25' (step 103a). As illustrated in FIG. 7, one side of the minimum rectangular shape in the horizontal direction is reduced by one wiring-pattern pitch, then the opposite side in the horizontal direction is reduced by one wiring-pattern pitch. Next, one side in the vertical direction is reduced by one wiring-pattern pitch, then the opposite side in the vertical direction is reduced by one wiring-pattern pitch, and so on. In this way the pin shape is successively reduced and changed (step 103b). Whenever this reduction and change is made, a number N' of 90°-turn wiring lines between the rectangular shapes following the reduction and change is calculated (step 103c). When the relation N'≧M is established, the reduction of the rectangular areas is ended (step 103d).

If the relation N'≧M is established, the processor 31 stores a reduced shape as the shape of a pin of interest and then determines whether the processing of steps 101, 103 has been ended for all part pins (step 104). If processing has ended, another pin is made the pin of interest and the processing from step 101 onward is repeated.

(3) Automatic wiring processing for 90° turns

When the processing (step 101) for finding locations at which diagonal wiring is required and the processing (step 103) for reducing and changing pin shape has been completed for all pins, the processor 31, based upon the wiring data and the shape data following the reduction and change, executes well-known automatic wiring processing for 90° turns and generates the 90°-turn wiring patterns PP1, PP2 [FIG. 5(c)] (step 105).

(4) Search processing for generating clearance error

When the automatic 90°-turn wiring processing with regard to a pin shape that has been reduced ends, the processor 31 obtains the clearance between the 90°-turn wiring pattern PP1 (or PP2) and the actual shapes 21–23 (or 23–25) of each of the part pins that have been reduced, determines whether the clearance is less than the stipulated value (step 107a) and adopts a location at which the clearance is less than the stipulated value as a location at which a clearance error is generated [the white circles in FIG. 5(c)] (step 107b).

The foregoing constitutes step 107.

(5) Processing for shaping wiring patterns

If locations at which a clearance error is generated are present, the processor 31 shapes the 90°-turn wiring patterns at these locations into diagonal wiring patterns [see the dashed lines in FIG. 5(c)] so as to satisfy the clearances (step 109) and finally creates the wiring patterns PPN1, PPN2 which includes the diagonal lines [see FIG. 5(b)].

Figure 8A:
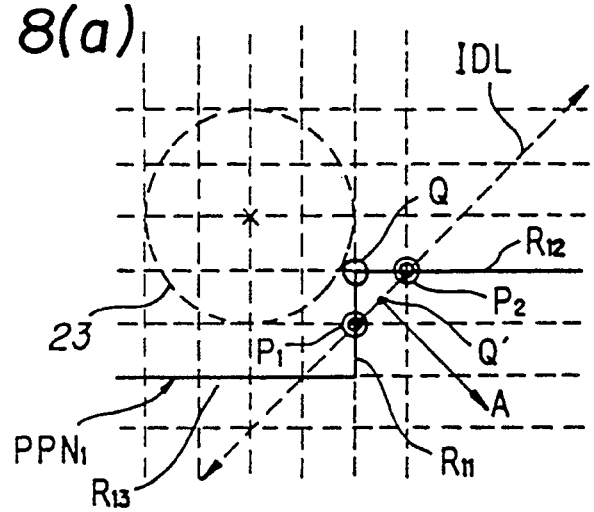
FIGS. 8(a)–(c) are first explanatory views of shaping processing.
Figure 8B:
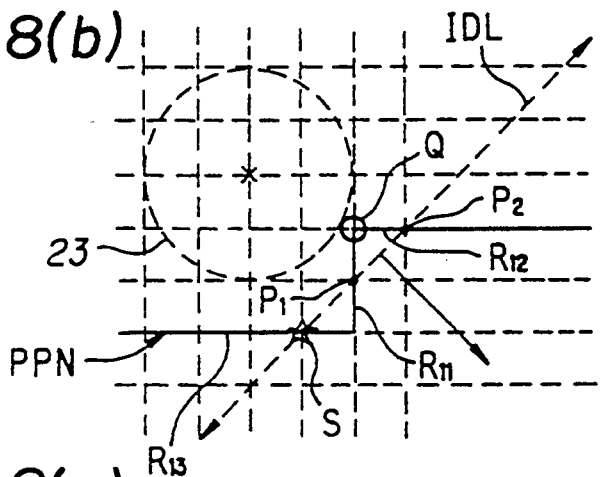

More specifically, the processor 31 extracts two line segments $R_{11}$, $R_{12}$ which form an angle (=90°) at a vertex Q [see FIG. 8(a)] serving as the clearance error (step 109a). Next, the processor 31 moves the intersection Q of the two line segments $R_{11}$, $R_{12}$ away (in the direction of arrow A) from the center of the pin shape 23, for which the clearance is inadequate, until the stipulated clearance is obtained, and obtains points of intersection $P_1$, $P_2$ between the two line segments $R_{11}$, $R_{12}$ and an infinite line IDL which passes through the intersection Q' resulting from movement and is perpendicular to the direction of movement, thereby obtaining a 45° line (step 109b).

Figure 8C:
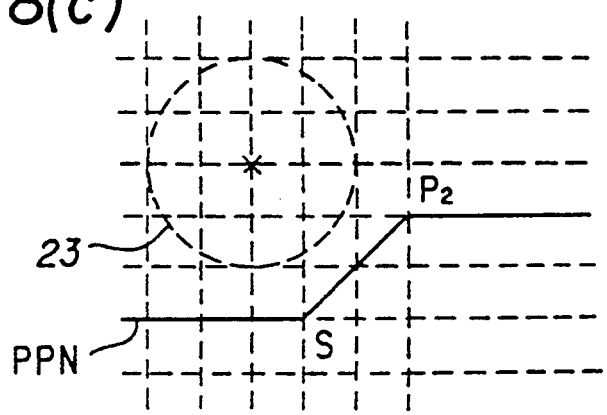

Thereafter, the processor 31 finds the designated number (usually one) of line segments $R_{13}$ connected to the two above-mentioned line segments $R_{11}$, $R_{12}$. If there is an intersection S between this line segment and the infinite line segment IDL and the value of the clearance is greater than the stipulated value, then a 45° line from the point $P_2$ to the intersection S is adopted as a new shaped pattern (diagonal line) [step 109c; FIG. 8(c)].

Figure 9A:
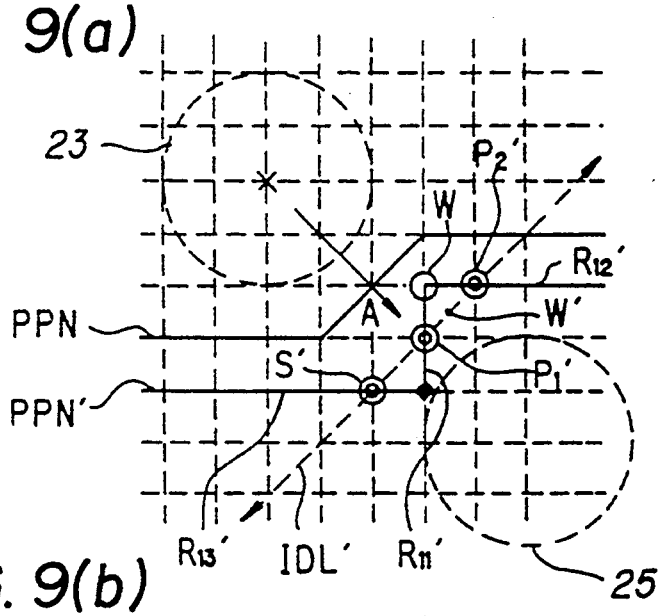
FIGS. 9(a) and (b) are explanatory views of shaping processing.
Figure 9B:
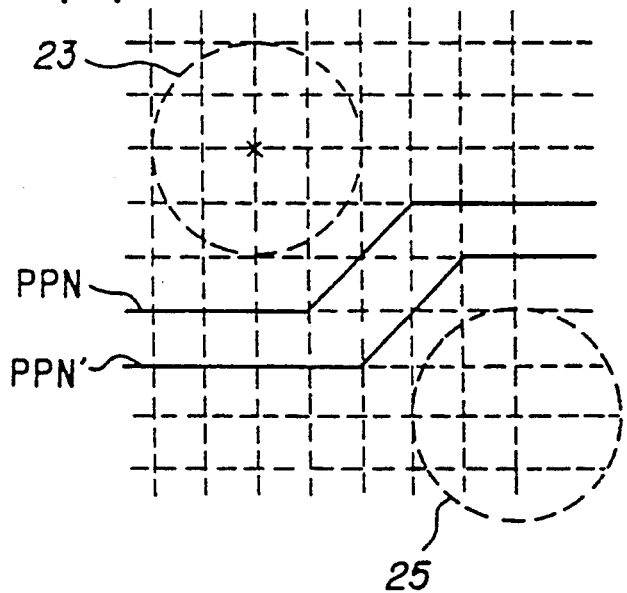

Next, it is determined whether the clearance relative to another wiring pattern PPN' [see FIG. 9(a)] no longer satisfies the stipulated value because of the above-described shaping. If this is indeed the case, the vertex W of the wiring pattern PPN' which no longer satisfies the stipulated value is moved away (in the direction of arrow A) from the center of the pin shape 23 until the stipulated clearance is obtained. The processor 31 then obtains an infinite line IDL' which passes through the intersection W' resulting from movement and is perpendicular to the direction of movement, and obtains points of intersection $P_1'$, $P_2'$ between two line segments $R_{11}'$, $R_{12}'$ and the infinite line IDL', thereby obtaining a 45° line. Next, the processor 31 finds a line segment $R_{13}'$ connected to the two above-mentioned line segments $R_{11}'$, $R_{12}'$. If there is an intersection S' between this line segment $R_{13}'$ and the infinite line segment IDL' and the value of the clearance is greater than the stipulated value, then a 45° line from the point $P_2'$ to the intersection S' is adopted as a new shaped pattern (diagonal line) [step 109d; FIG. 9(b)]. This is continuous processing.

Thereafter, identical processing is executed with regard to all 90°-turn wiring patterns between pin shapes of interest by means of continuous processing. If, in continuous processing, a state is attained in which shaping cannot be performed (i.e., a state in which a clearance cannot take on a value greater than the stipulated value), processing is executed in accordance with the initially set parameters of the automatic wiring system. For example, only the final error line segment is excluded and this section is adopted as being unwired (step 109e). It should be noted that processing for rewiring an unwired section is performed after automatic wiring processing ends.

When processing (step 107) for finding areas at which the clearance error is generated and processing (step 109) for shaping the wiring pattern ends, it is determined (step 110) whether the clearance check has been completed for all locations. If it has not been completed, processing from step 107 onward is repeated. If it has been completed, automatic wiring processing is completed.

(d) Modification of the Invention

Figure 10A:
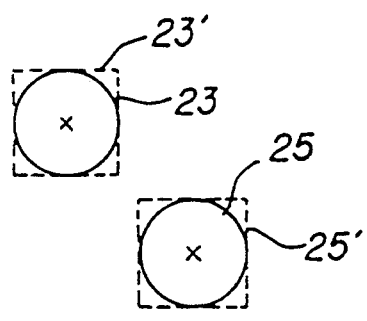
FIGS. 10(a) and (b) are diagrams for describing problems resulting from a change in shape.
Figure 10B:
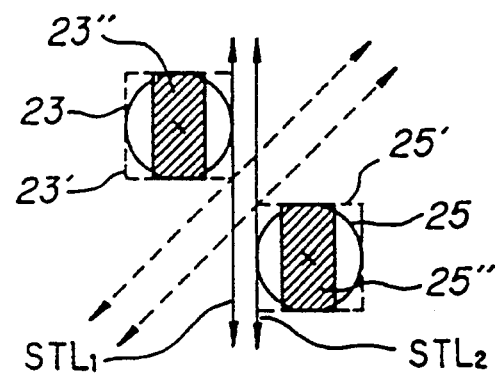

In the foregoing, the minimum rectangular shapes 23', 25' of the respective pin shapes 23, 25 (FIG. 10) are reduced and changed so as to obtain a wiring capacity equal to or greater than that of diagonal wiring when 90°-turn wiring processing is executed, after which 90°-turn wiring processing is executed based upon the pin shapes 23'', 25'' resulting from reduction. However, prior to the reduction, the existence of a straight wiring line in the vertical or horizontal direction is impossible, as shown in FIG. 10(a) wherein not even one line passes in vertical and horizontal directions. Owing to the reduction in the pin shape after 90° wiring capacity calculation, however, the existence of two straight wiring lines $STL_1$, $STL_2$ in the vertical direction becomes possible between the two reduced pin shapes 23'', 25'', as shown in FIG. 10(b).

In order to find a method through which wiring can be performed simply in the automatic route search processing (step 105) based by 90° turns, if the existence of one straight wiring line in the vertical or horizontal direction becomes possible, then the possibility that this one straight wiring line is used in a wiring route becomes greater. When this is the case, the pattern shaping processing in step 109 becomes extremely troublesome and the algorithm of steps 109a through 109e can no longer by applied.

Figure 11A:
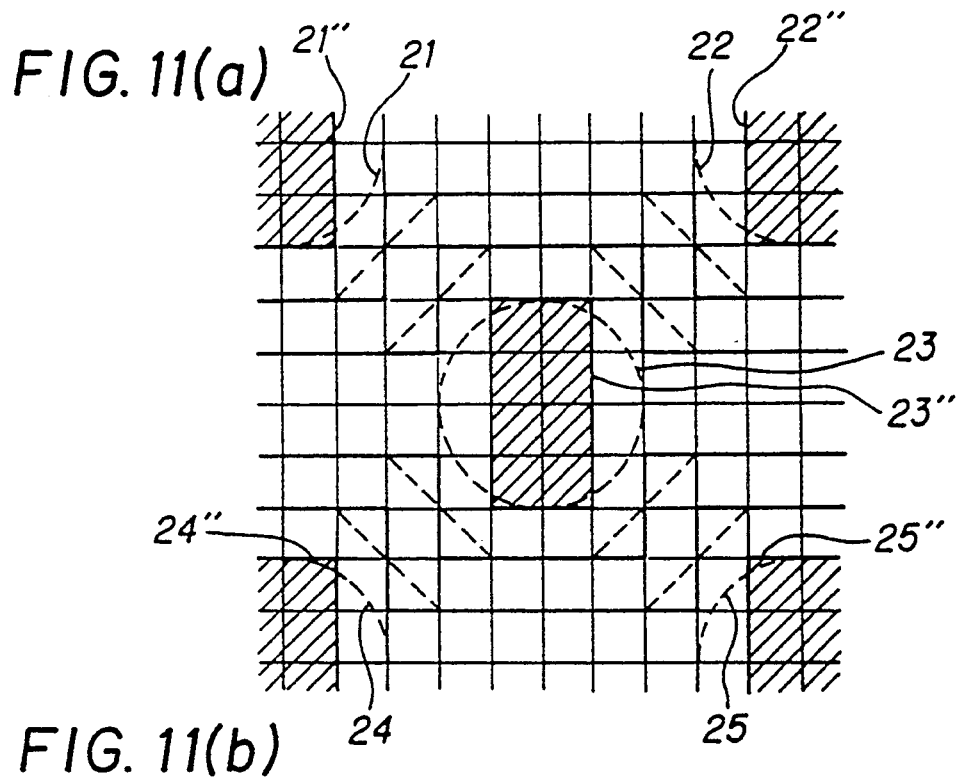
FIGS. 11(a) and (b) are diagrams, first explanatory views of revision of reduced shapes.
Figure 11B:
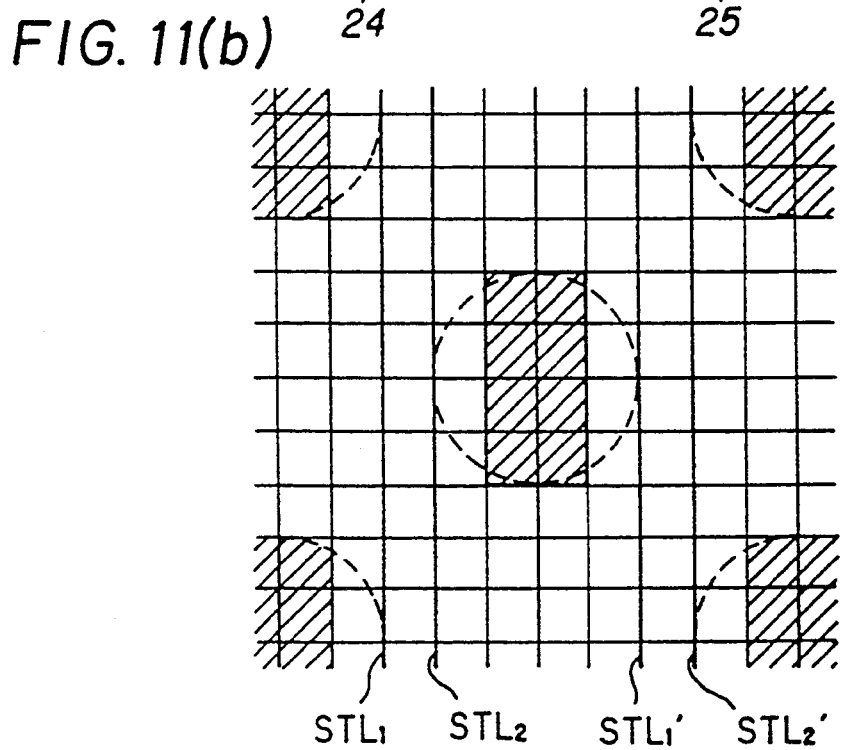

Accordingly, in the present invention, when straight wiring lines $STL_1$, $STL_2$; $STL_1'$, $STL_2'$ [FIG. 11(b)] in the vertical or horizontal direction are capable of existing between the pin shapes 21''–25'' obtained by reducing the minimum rectangular areas of pin shapes 21–25, respectively [FIG. 11(a)], so as to obtain a wiring capacity equal to or greater than the diagonal lines, a linear shape DMF FIGS. 12(a) and (b) of a prescribed length is appended to the shapes 21'–25', which result from the size reduction of each of the pins, perpendicular to the directions in which existence of the straight lines has become possible, and the automatic route search processing of step 105 is executed regarding the shapes to which the linear shape DMF has been appended as being new pin shapes resulting from reduction.

If this expedient is adopted, then the vertical wiring lines will become 90°-turn wiring lines which detour around the linear shapes DMF. Even though the linear shape DMF is appended, the wiring lines in the horizontal direction are completely unaffected and the horizontal wiring lines before addition of DMF [FIG. 11(a)] and after addition of DMF [FIG. 12(b)] coincide. Furthermore, the width of the linear shape DMF may be made the width of one wiring line, and the length thereof may be made the same as the width of the part pin, by way of example.

Figure 13:
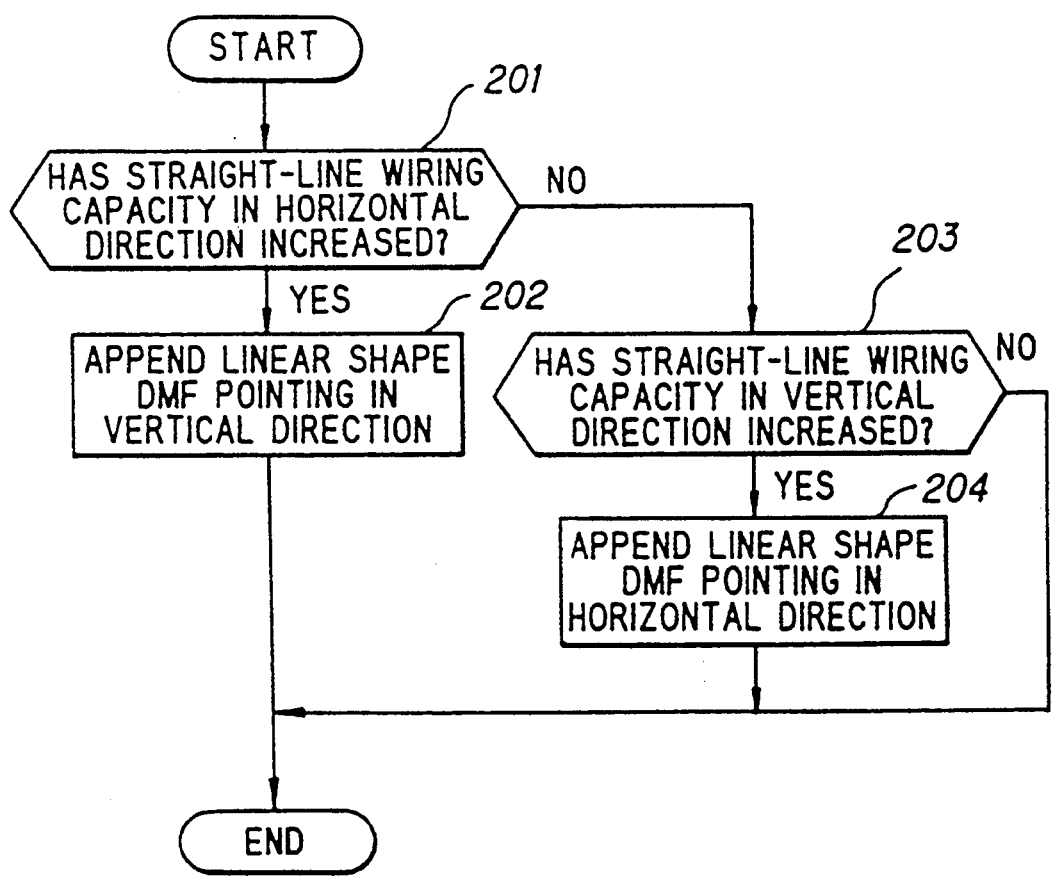
FIG. 13 is a flowchart of processing for revising reduced shapes.
Figure 14A:
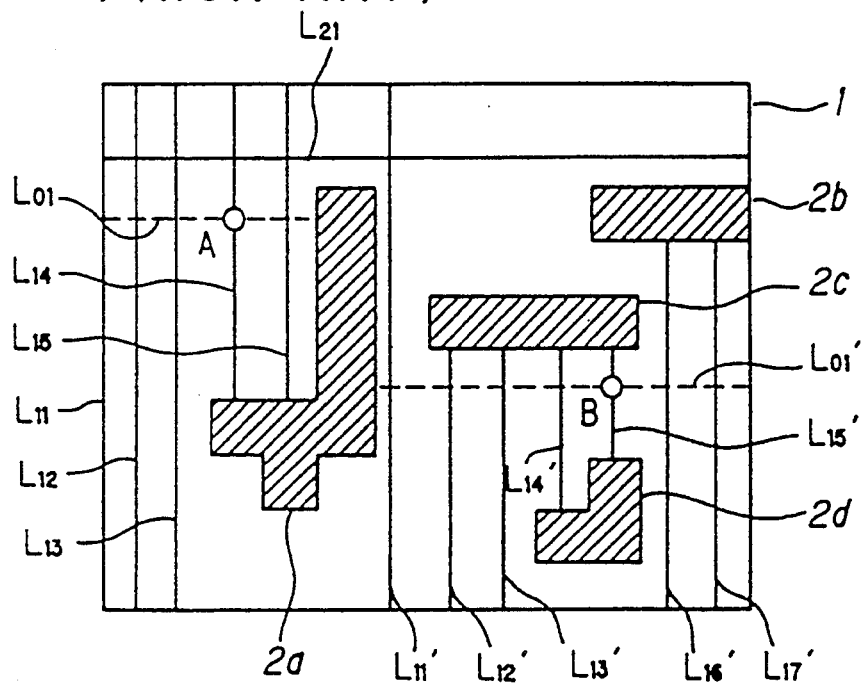
FIGS. 14(a) and 14(b) are diagrams illustrating a prior art line search method.
Figure 14B:
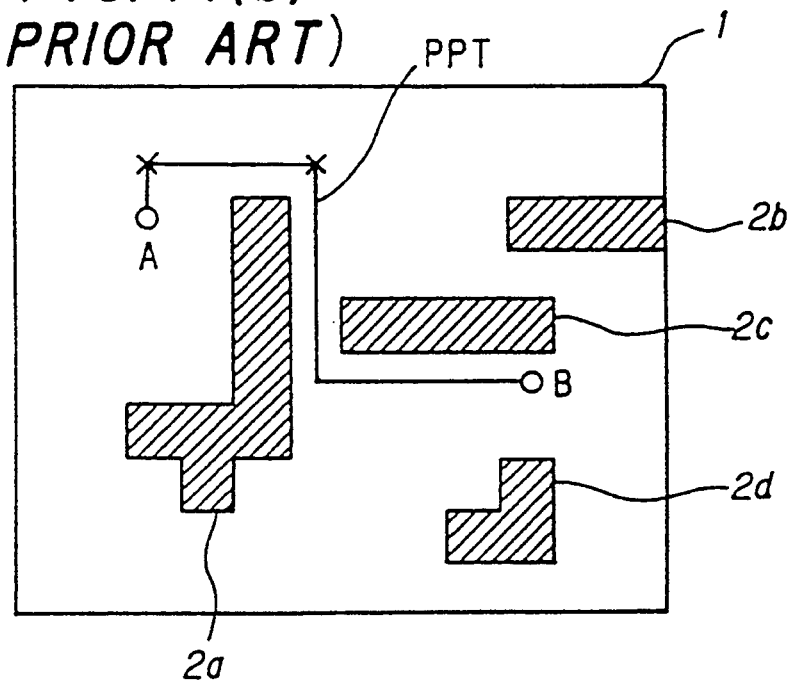
Figure 15A:
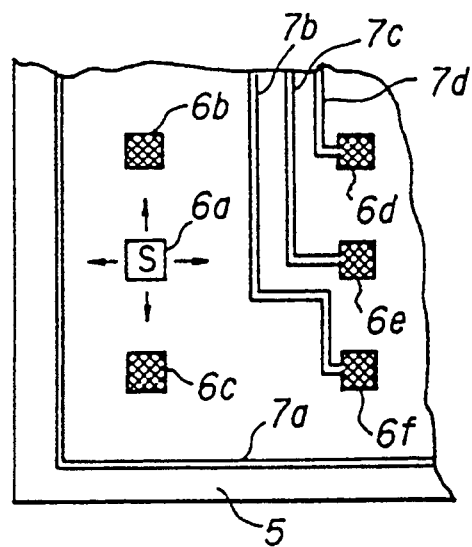
FIGS. 15(a), 15(b) and 15(c) are diagrams illustrating a prior art area search method.
Figure 15B:
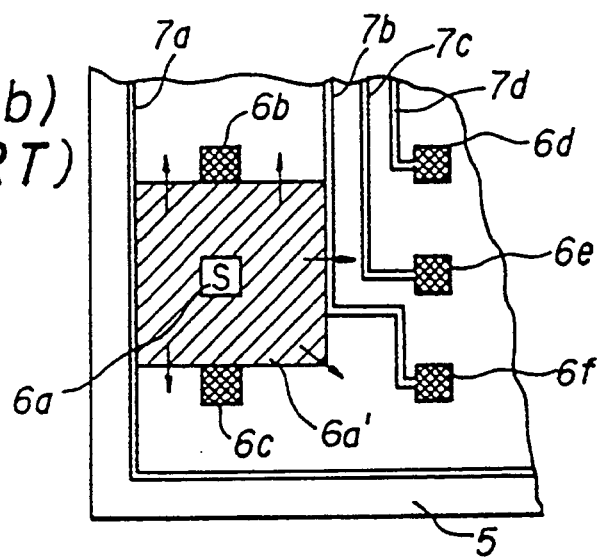
Figure 15C:
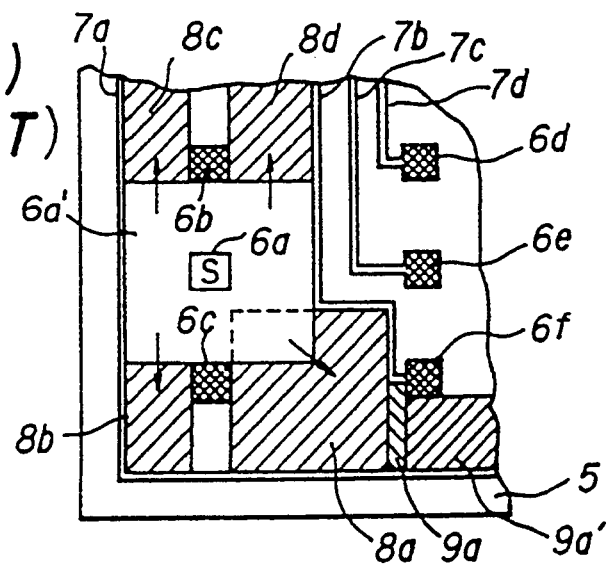
Figure 16:
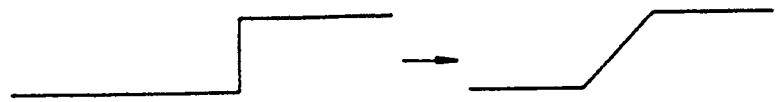
FIG. 16 is a first explanatory view of a problem encountered in the prior art.
Figure 17A:
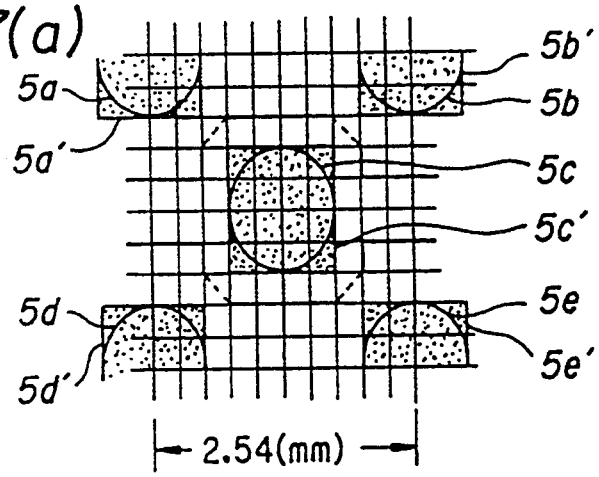
FIGS. 17(a) and 17(b) are second explanatory views of problems encountered in the prior art.
Figure 17B:
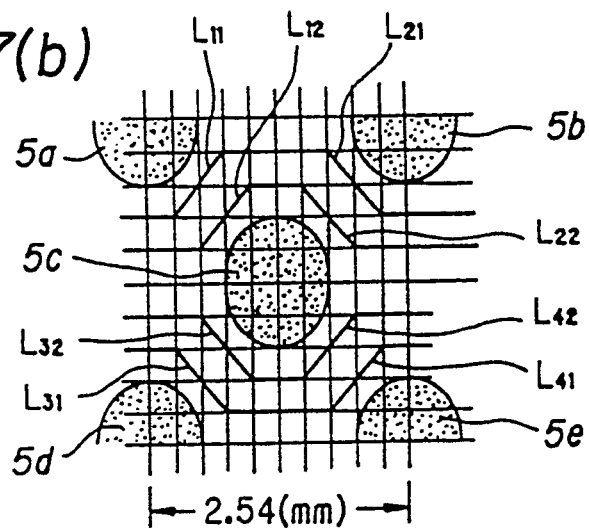

FIG. 13 is a flowchart of the foregoing processing. This processing is inserted after step 103d in FIG. 3, by way of example. Specifically, when the processing for reducing and changing the pin shapes ends (step 103d) so as to obtain a wiring capacity equal to or greater than the diagonal lines, it is determined (step 201) whether the straight-line wiring capacity in the horizontal direction has increased in comparison with that which prevailed before the reduction in pin shape. If it has increased, the linear shape DMF oriented in the vertical direction is appended to the reduced shape to revise the reduced shape (step 202). If the straight-line wiring capacity in the horizontal direction has not increased in comparison with that which prevailed before the reduction in pin shape, then it is determined (step 203) whether the straight-line wiring capacity in the vertical direction has increased in comparison with that which prevailed before the reduction in pin shape. If it has increased, the linear shape DMF oriented in the horizontal direction is appended to the reduced shape to revise the reduced shape (step 204). If the straight-line wiring capacity in the vertical direction has not increased in comparison with that which prevailed before the reduction in pin shape, then processing for changing the reduced shape is terminated.

In accordance with the present invention, by applying predetermined pre-processing and post-processing before and after 90°-turn wiring processing, diagonal wiring can be performed automatically by simple processing using the conventional 90°-turn wiring processing. Moreover, the number of wiring lines capable of being disposed between parts can be increased to make high-density mounting possible.

Further, part pin shapes situated within a set distance from a prescribed part pin of interest are obtained. If part pins are present within the set distance, the pin shape of the pin of interest and the shapes of the respective part pins within the set distance are approximated by rectangular shapes, and the number N of 90°-turn wiring lines which satisfy the clearances between both approximated pin shapes is obtained. Next, the number M of 45°-direction wiring lines M which satisfy the clearances between the pin of interest and the actual shapes of the part pins within the set distance is obtained. When $N<M$ holds, it is judged that diagonal wiring is required between both pins. Owing to this arrangement, locations requiring diagonal wiring can be found automatically through simple processing.

In accordance with the present invention, one side of the rectangular shape of each pin in one direction is reduced by one wiring-pattern pitch, then the opposite side in the same direction is reduced by one wiring-pattern pitch. Next, one side in the other direction is reduced by one wiring-pattern pitch, then the opposite side in the same direction is reduced by one wiring-pattern pitch, and so on. In this way the pin shape is successively reduced and changed. Whenever this reduction and change is made, a number N' of 90°-turn wiring lines between the rectangular shapes following the reduction and change is obtained. The reduction and change in part pin shape to a predetermined shape can be performed automatically through simple processing. Moreover, the conventional automatic wiring processing for 90° turns can be applied using the pin shapes obtained after the reduction and change.

Further, in accordance with the invention, the clearance between an actual pin shape of a part pin whose shape has been changed and a wiring pattern obtained by 90° automatic wiring processing is found, and the location of a clearance error is obtained by judging whether this clearance is less than a stipulated value. As a result, location of a clearance error can be found automatically through simple processing.

Furthermore, in accordance with the present invention, in a case where the number of straight-line wiring lines in the horizontal or vertical direction increases between approximated pin shapes owing to the reduction and change in shape, a linear shape having a length conforming to the actual part pin shape is appended to the approximated shape of each pin perpendicular to the direction in which the increase has occurred. Then, in the automatic wiring processor, automatic wiring processing is executed based upon the approximated shape having the linear shape appended thereto. This makes it possible to perform more easily the processing for shaping the wiring patterns.

As many apparently widely different embodiments of the present invention can be made without departing from the spirit and scope thereof, it is to be understood that the invention is not limited to the specific embodiments thereof except as defined in the appended claims.

What is claimed is:

1. An automatic wiring method for performing wiring which turns at angles in units of 90° between prescribed pins based upon part placement data, comprising:

a first step of finding locations at which diagonal wiring is required at the time of the wiring processing;

a second step of approximating shapes of part pins associated with said diagonal wiring locations by rectangular shapes and reducing and changing said approximated shapes into shapes capable of being wired by 90° turns;

a third step of executing automatic wiring processing for 90° turns;

a fourth step of finding a location at which a clearance between a wiring pattern obtained by the wiring processing for 90°-turns and an actual part pin becomes less than a stipulated value and a clearance error is generated; and a fifth step of shaping a 90°-turn wiring pattern at said clearance location into a diagonal wiring pattern so as to satisfy the clearance.

2. The method according to claim 1, wherein said first step includes the steps of:

obtaining a part pin shape within a set distance from the center of a prescribed part pin shape of interest;

if a part pin shape is present within said set distance, approximating said pin shape of interest and the part pin shape within said set distance by respective minimum rectangular areas which include said shapes, and obtaining a number N of 90°-turn wiring lines which satisfy the clearance between both approximated pin shapes;

obtaining a number M of 45°-direction wiring lines which satisfy the clearance between said pin of interest and the actual shape of the part pin within the set distance; and determining whether diagonal wiring is required between both of said pin shapes when $N<M$ holds.

3. The method according to claim 1, wherein said second step further includes the steps of:

reducing one side of a minimum rectangular shape of each pin in one direction by one wiring-pattern pitch, reducing an opposite side in said one direction by one wiring-pattern pitch, reducing one side in the other direction by one wiring-pattern pitch, and reducing an opposite side in said other direction by one wiring-pattern pitch, and thereafter successively reducing and changing the pin shape one wiring-pattern pitch at a time in the above-mentioned sequence;

obtaining a number N' of 90°-turn wiring lines between rectangular shapes following the reduction and change thereof whenever the reduction and change by one wiring-pattern pitch is made; and ending the reducing and changing when $N' \geq M$ holds.

4. The method according to claim 3, wherein, in said third step, automatic wiring processing for 90° turns is executed using the pin shapes obtained after the reduction and change.

5. The method according to claim 1, wherein said fourth step includes the steps of:

obtaining a clearance between an actual pin shape of a part pin whose shape has been changed and a wiring pattern obtained by automatic wiring processing for 90° turns; and determining whether said clearance is less than the stipulated value and obtaining, as the location of a clearance error, a location at which the clearance is less than said stipulated value.

6. The method according to claim 5, wherein said fifth step includes the steps of:

moving an intersection between two line segments, which form a 90°-turn wiring pattern at a clearance-error occurrence location, to a position at which the stipulated value is obtained;

shaping said 90°-turn wiring pattern by a diagonal wiring pattern which passes through an intersection after it has been moved; and if a clearance between said diagonal wiring pattern and another 90°-turn wiring pattern is less than the stipulated value, similarly shaping said another 90°-turn wiring pattern by a diagonal wiring pattern.

7. The method according to claim 3, wherein said second step further includes the steps of:

determining whether a number of straight-line wiring lines in a horizontal or a vertical direction increases between approximated shapes of both pins owing to the reduction and change in shape; and in case of an increase, appending a linear shape of a prescribed width having a length conforming to actual part pin shape, to the approximated shape of each pin perpendicular to the direction in which the increase occurred, and adopting the resulting approximated shape as a new approximated shape.

8. The method according to claim 7, wherein, in said third step, automatic wiring processing is executed based upon the approximated shape having said linear shape appended thereto.

9. The method according to claim 2, wherein said second step further includes the steps of:

reducing one side of said minimum rectangular shape of each pin in one direction by one wiring-pattern pitch, reducing an opposite side in said one direction by one wiring-pattern pitch, reducing one side in the other direction by one wiring-pattern pitch, and reducing an opposite side in said other direction by one wiring-pattern pitch, and thereafter successively reducing and changing the pin shape one wiring-pattern pitch at a time in the above-mentioned sequence;

obtaining a number N' of 90°-turn wiring lines between rectangular shapes following the reduction and change thereof whenever the reduction and change by one wiring-pattern pitch is made; and ending the reducing and changing when $N' \geq M$ holds.

10. The method according to claim 9, wherein, in said third step, automatic wiring processing for 90° turns is executed using the pin shapes obtained after the reduction and change.

11. The method according to claim 10, wherein said fourth step includes the steps of:

obtaining a clearance between an actual pin shape of a part pin whose shape has been changed and a wiring pattern obtained by automatic wiring processing for 90° turns; and determining whether said clearance is less than the stipulated value and obtaining, as the location of a clearance error, a location at which the clearance is less than said stipulated value.

12. The method according to claim 11, wherein said fifth step includes the steps of:

moving an intersection between two line segments, which form a 90°-turn wiring pattern at a clearance-error occurrence location, to a position at which the stipulated value is obtained;

shaping said 90°-turn wiring pattern by a diagonal wiring pattern which passes through the intersection after it has been moved; and if a clearance between said diagonal wiring pattern and another 90°-turn wiring pattern is less than the stipulated value, similarly shaping said another 90°-turn wiring pattern by a diagonal wiring pattern.

13. The method according to claim 9, wherein said second step further includes the steps of:

determining whether a number of straight-line wiring lines in a horizontal or a vertical direction increases between approximated shapes of both pins owing to the reduction and change in shape; and in the case of an increase, appending a linear shape of a prescribed width having a length conforming to actual part pin shape to the approximated shape, of each pin perpendicular to the direction in which the increase occurred, and adopting the resulting approximated shape as a new approximated shape.

14. The method according to claim 13, wherein, in said third step, automatic wiring processing is executed based upon the approximated shape having said linear shape appended thereto.

15. The method according to claim 4, wherein said fourth step includes the steps of:

obtaining a clearance between an actual pin shape of a part pin whose shape has been changed and a wiring pattern obtained by automatic wiring processing for 90° turns; and determining whether said clearance is less than the stipulated value and obtaining, as the location of a clearance error, a location at which the clearance is less than said stipulated value.

16. The method according to claim 15, wherein said fifth step includes the steps of:

moving an intersection between two line segments, which form a 90°-turn wiring pattern at a clearance-error occurrence location, to a position at which the stipulated clearance is obtained;

shaping said 90°-turn wiring pattern by a diagonal wiring pattern which passes through an intersection after it has been moved; and if a clearance between said diagonal wiring pattern and another 90°-turn wiring pattern is less than the stipulated value, similarly shaping said another 90°-turn wiring pattern by a diagonal wiring pattern.

* * * * *

UNITED STATES PATENT AND TRADEMARK OFFICE
CERTIFICATE OF CORRECTION

PATENT NO. : 5,373,628
DATED : December 20, 1994
INVENTOR(S) : Akihiko Suehiro, et al It is certified that error appears in the above-indentified patent and that said Letters Patent is hereby corrected as shown below:

Column 1, line 61, change "(b)" to

--(b),--.

Column 4, line 6, change "diagram" to

--diagrams--;

line 19, change "turns" to

--turns," and change "14,"

to --14--.

Column 5, line 41, change "(c)" to

--(c),--;

line 51, change "$N \gtreqless M$" to

--$N \geq M$--.

UNITED STATES PATENT AND TRADEMARK OFFICE
CERTIFICATE OF CORRECTION

PATENT NO. : 5,373,628

DATED : December 20, 1994

INVENTOR(S) : Akihiko Suehiro, et al

It is certified that error appears in the above-indentified patent and that said Letters Patent is hereby corrected as shown below:

Column 6, line 29, change "N>M" to

--$N \geq M$--;

line 31, change "N>M" to

--$N \geq M$--.

Figure 12A:
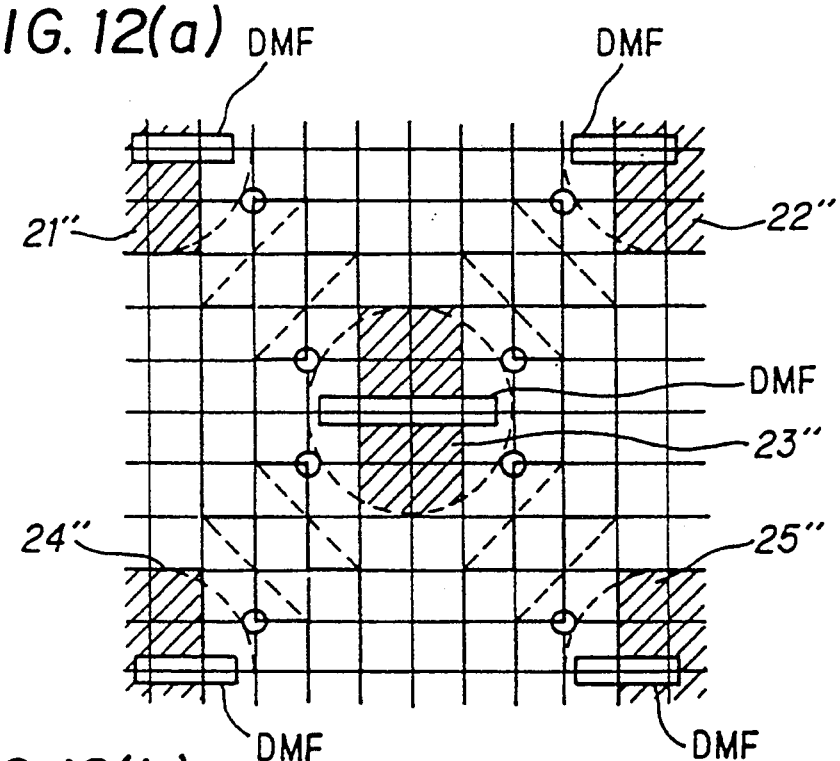
FIGS. 12(a) and (b) are second explanatory views of revision of reduced shapes.
Figure 12B:
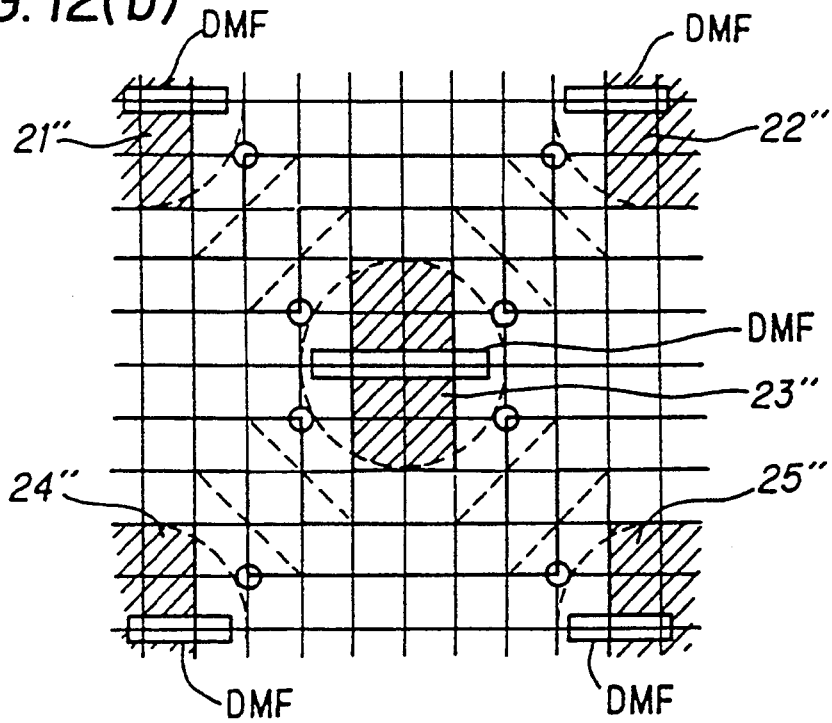

Column 8, line 31, change "Figs. 12(a) and (b)" to

--[Figs. 12(a) and (b)]--.

Column 11, line 17, change "the" to

--a--;

line 60, change "N'>M" to

--$N' \geq M$--.

UNITED STATES PATENT AND TRADEMARK OFFICE
CERTIFICATE OF CORRECTION

PATENT NO. : 5,373,628
DATED : December 20, 1994
INVENTOR(S) : Akihiko Suehiro, et al It is certified that error appears in the above-indentified patent and that said Letters Patent is hereby corrected as shown below:

Column 12, line 18, change "the" to --an--;

line 33, change "shape" (first occurrence) to --shape,--, and change "shape," (second occurrence) to --shape--.

Signed and Sealed this

Twenty-fifth Day of April, 1995

Attest:

BRUCE LEHMAN

*Attesting Officer*  *Commissioner of Patents and Trademarks*